United States Patent
Kikuchi

(10) Patent No.: US 6,204,075 B1
(45) Date of Patent: Mar. 20, 2001

(54) METHOD OF DETECTING DEFECTS IN A WIRING PROCESS

(75) Inventor: Hiroaki Kikuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/310,136

(22) Filed: May 12, 1999

(30) Foreign Application Priority Data

May 15, 1998 (JP) .................................................. 10-132878

(51) Int. Cl.$^7$ .................................................. H01L 21/66
(52) U.S. Cl. .................................................. 438/18; 438/14
(58) Field of Search .................................................. 438/14, 16, 4, 438/17, 18

(56) References Cited

U.S. PATENT DOCUMENTS

| | | | |
|---|---|---|---|
| 4,417,203 | * | 11/1983 | Pfeiffer et al. . |
| 4,650,333 | * | 3/1987 | Crabb et al. . |
| 5,821,761 | * | 10/1998 | Shida et al. . |
| 6,038,018 | * | 3/2000 | Yamazaki et al. . |

FOREIGN PATENT DOCUMENTS

| | | |
|---|---|---|
| 2-174138 | 7/1990 | (JP) . |
| 4-310877 | 11/1992 | (JP) . |
| 4-314032 | 11/1992 | (JP) . |
| 5-144917 | 6/1993 | (JP) . |

\* cited by examiner

*Primary Examiner*—Charles Bowers
*Assistant Examiner*—Evan Pert
(74) *Attorney, Agent, or Firm*—Young & Thompson

(57) ABSTRACT

A circuit, a semiconductor wafer including the circuit and a method for detecting defects of wiring used for detecting a malfunction in a wiring fabrication process during semiconductor device manufacturing. The circuit comprises an insulating film formed on a semiconductor substrate, a first wiring which is formed on the insulating film formed on the semiconductor substrate and is in an electrically floating condition, and a second wiring which is formed on the insulating film formed on the semiconductor substrate and is disposed adjacent to the first wiring and is in an electrically floating condition, wherein the capacitance between the second wiring and the semiconductor substrate is larger than the capacitance between the first wiring and the semiconductor substrate. Portions of the first and second wiring are scanned by an electron beam on the surfaces thereof, and secondary electrons emitted from the first wiring and second wiring are detected.

11 Claims, 5 Drawing Sheets

PRIOR ART

PRIOR ART

METHOD OF DETECTING DEFECTS IN A WIRING PROCESS

FIELD OF THE INVENTION

The present invention relates generally to detecting defects of wiring in semiconductor devices. More particularly, the present invention relates to a circuit and a semiconductor wafer used for detecting defects of wiring used for detecting the existence and nonexistence of abnormal conditions in a process for forming conductors or wiring in a manufacturing line of semiconductor devices, and a method for detecting defects of wiring using such a circuit and semiconductor wafer.

BACKGROUND OF THE INVENTION

Defects of wiring or conductors, especially short circuits of wiring or conductors, in a semiconductor device are fatal defects and it is impossible to ship semiconductor devices having such defects as quality products. That is, defects of wiring have a large influence on the yield of semiconductor manufacturing. Therefore, in order to improve the yield, it is extremely important to prevent defects of wiring beforehand.

In order to prevent such defects of wiring beforehand, one or more wafers for detecting defects of wiring are periodically introduced into the manufacturing line of semiconductor devices. FIGS. 6 and 7 illustrate conventional test patterns formed on a semiconductor wafer for detecting defects of wiring. In particular, such test patterns are formed on a semiconductor wafer in a manufacturing line to be tested and the test patterns formed are inspected, and thereby examination is performed on whether or not formation of wiring is normally attained in this manufacturing line.

Explanation will now be made on the conventional test patterns shown in FIGS. 6 and 7. FIG. 6 is a plan view of the test patterns, and FIG. 7 is a schematic cross sectional view of the test patterns shown in FIG. 6. As shown in these drawings, test pads 34 and test wires 36 are formed on an insulation layer or film 32 which covers a semiconductor substrate 30. As shown in FIG. 6, each of the test pads 34 is formed such that each of the test pads 34 is in an electrically floating condition. The test wires 36 are electrically connected to one portion in that a portion of each of the test wires 36 are commonly connected to a diffusion layer 40 provided on the semiconductor substrate 30, via a contact hole 38, as shown in FIG. 7. These test patterns are formed on the whole surface of the wafer for detecting defects of wiring in a manufacturing line to be tested.

Now, explanation will be made of a method for detecting defects of wiring using the above-mentioned wafer for detecting defects of wiring. First, a semiconductor wafer on which no test patterns are formed is introduced into a manufacturing line to be tested, and test patterns shown in FIGS. 6 and 7 are formed on such semiconductor wafer to fabricate a semiconductor wafer for detecting defects of wirings. Thereafter, an electron beam is radiated and scanned on each of the test pads 34 of the test patterns formed as mentioned above, and the quantity of electric charge of each of the test pads 34 charged up (accumulated) by the electron beam is measured or observed, for example, by using a SEM (scanning electron microscope).

In this case, a particular quantity of accumulated charge, determined by a capacitance value between each of the test pads 34 and the semiconductor substrate 30, is observed from each of the test pads 34. However, if there is an abnormal condition with respect to the wiring 36, such as deviation of location of a wire, and a wire 36 and a test pad 34 contact or electrically short-circuit each other, the test pad 34 contacting the wire 36 is electrically connected to the semiconductor substrate 30 via the wiring 36. Therefore, the quantity of electric charge accumulated in the test pad 34 becomes very small.

By observing the quantity of electric charge in each of the test pads 34, it is possible to detect one or more test pads 34 contacting the wiring 36. If such one or more test pads 34 are found, it is possible to know that defects of wiring tend to occur in locations where such test pads are found.

The test pattern and method of test mentioned above are described in "IEEE TRANSACTIONS ON SEMICONDUCTOR MANUFACTURING, P.384–389 (1997)".

However, in the conventional test patterns mentioned above, since the area of each of the test pads 34 is large, the area used for forming the test wirings 36 becomes narrow and, therefore, precision of the test is deteriorated. Also, since the conventional test patterns greatly differ from wiring patterns of actual semiconductor devices, reliability of the test itself is not high.

SUMMARY OF THE INVENTION

Therefore, it is an object of the present invention to provide a circuit and a semiconductor wafer for detecting defects of wiring and a method for detecting defects of wiring, wherein a malfunction of the fabricating process of wiring in a semiconductor manufacturing line can be detected with high precision.

It is another object of the present invention to provide a circuit and a semiconductor wafer for detecting defects of wiring, and a method for detecting defects of wiring, wherein a malfunction of the fabricating process of wiring in a semiconductor manufacturing line can be detected in a condition near to the actual manufacturing condition, thereby realizing high test reliability.

It is another object of the present invention to provide a circuit and a semiconductor wafer for detecting defects of wiring which can be easily fabricated and which have test patterns near wiring patterns of actual semiconductor devices, and to provide a method for detecting defects of wiring using such a circuit and semiconductor wafer, thereby providing easy and reliable detection of defective wiring.

According to an aspect of the present invention, there is provided a circuit for detecting defects of wiring used for detecting a malfunction of the fabrication process of wiring during semiconductor device manufacturing. The circuit comprises an insulating film formed on a semiconductor substrate, a first wiring which is formed on the insulating film formed on the semiconductor substrate and is in an electrically floating condition, and a second wiring which is formed on the insulating film formed on the semiconductor substrate and is disposed adjacent the first wiring and is in an electrically floating condition. In this circuit structure, the capacitance between the second wiring and the semiconductor substrate is made larger than the capacitance between the first wiring and the semiconductor substrate.

According to another aspect of the present invention, there is provided a method for detecting defects of wiring to detect a malfunction of the fabrication process of wiring during semiconductor device manufacturing. The method comprises forming a plurality of circuits for detecting defects of wiring on an insulating film formed on a semiconductor substrate, in a manufacturing line to be tested. The circuit comprises a first wiring which is in an electrically floating condition, and a second wiring which is in an electrically floating condition and which is disposed adjacent the first wiring. The capacitance between the second wiring and the semiconductor substrate is larger than the capacitance between the first wiring and the semiconductor substrate. The method further comprises scanning an electron beam on the surfaces of the first wiring and second wiring, and detecting secondary electrons emitted from the first wiring and the second wiring.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

With reference to the drawings, a circuit for detecting defects of wiring according to an embodiment of the present invention will now be explained. A plurality of such circuits for detecting defects of wiring described below are formed on a semiconductor wafer in a manufacturing line to be tested, thereby fabricating a semiconductor wafer for detecting defects of wiring. The semiconductor wafer is periodically introduced into the manufacturing line of a semiconductor device to be tested to prevent, beforehand, defective or inferior formation of wiring due to the malfunction of the semiconductor manufacturing line. The semiconductor wafer for detecting defects of wiring is used to test whether or not formation of wiring is normally performed in the semiconductor manufacturing line.

Figure 1:
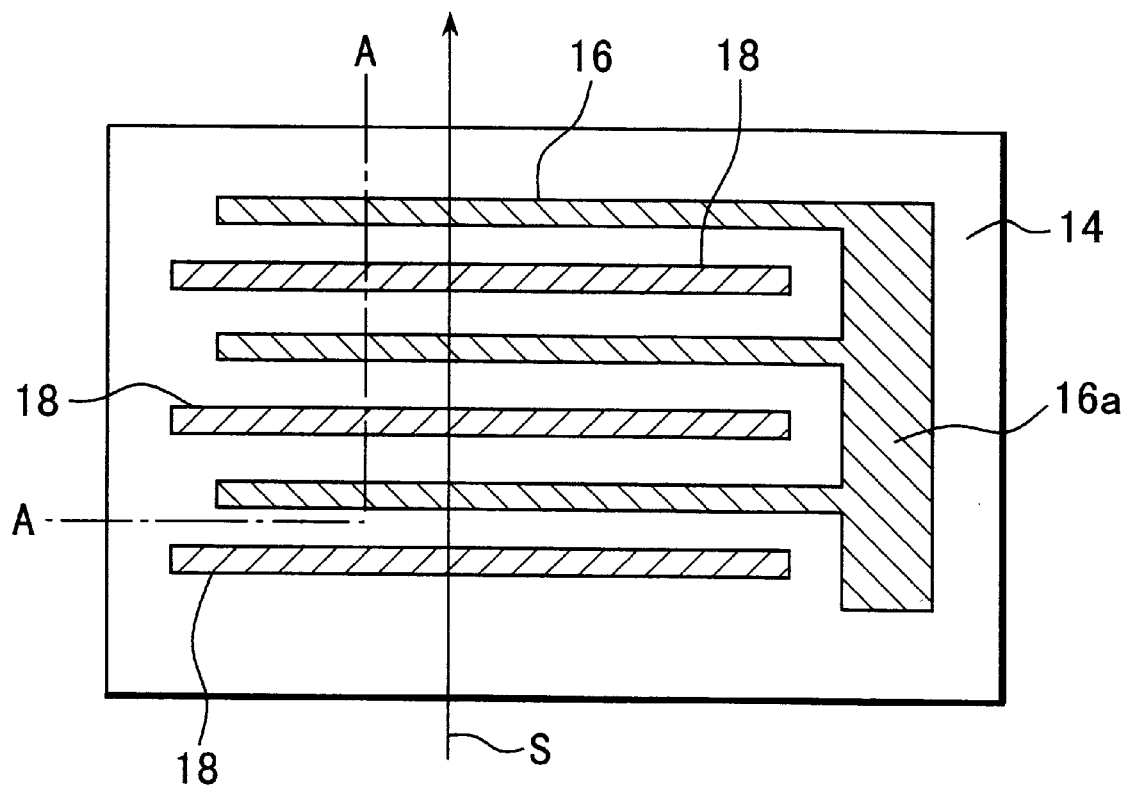
FIG. 1 is a plan view of a circuit for detecting defects of wiring according to an embodiment of the present invention.
Figure 2:
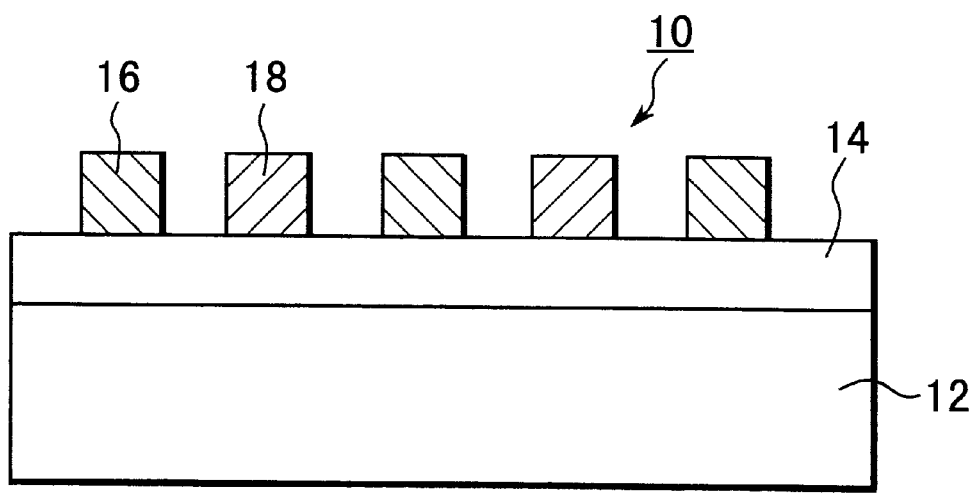
FIG. 2 is a sectional view of the circuit of FIG. 1, taken along the line A—A of FIG. 1.
Figure 3:
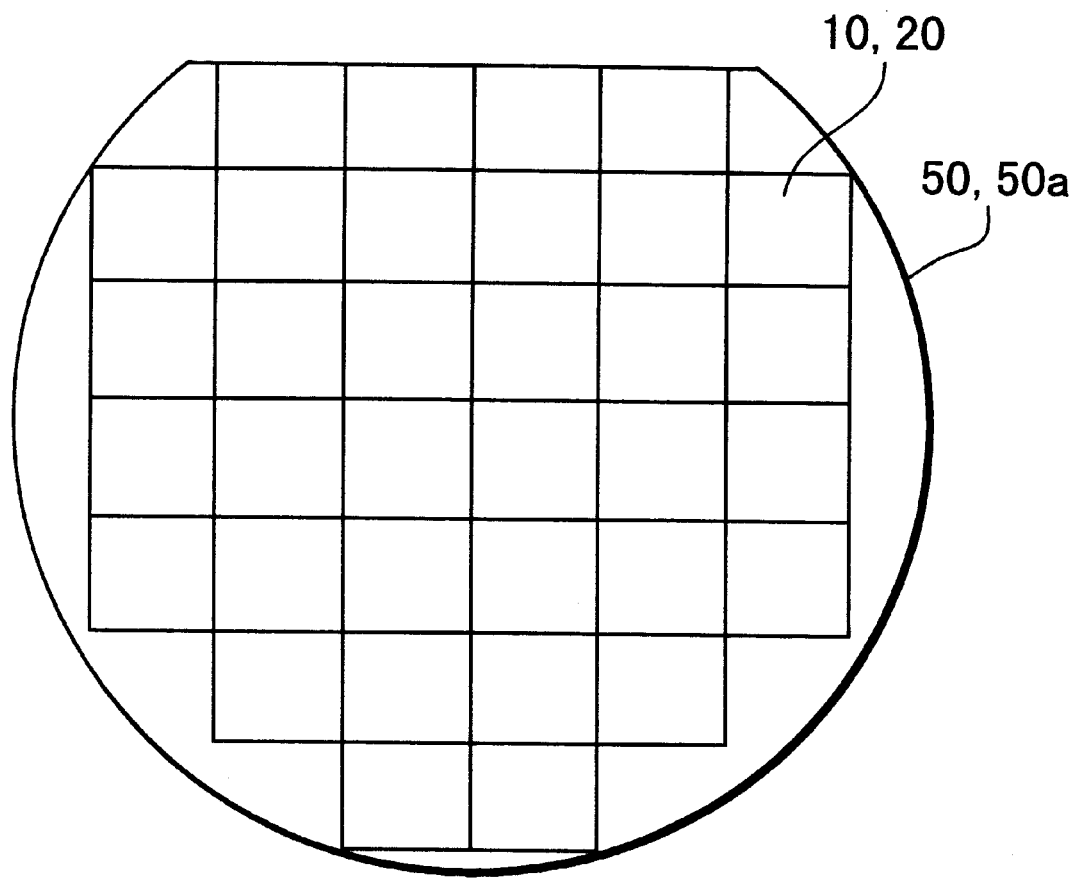
FIG. 3 is a plan view illustrating a semiconductor wafer for detecting defects of wiring on which the circuit for detecting defects of wiring is formed.

FIG. 1 is a plan view illustrating a circuit wiring 10 for detecting defects of wiring in accordance with an embodiment of the present invention, and FIG. 2 is a cross sectional view of the circuit 10 taken along the line A—A of FIG. 1. As shown in FIG. 1 and FIG. 2, the circuit for detecting defects of wiring 10 according to this embodiment comprises wires or conductors 16 and wires or conductors 18 which are formed on an insulating layer 14 covering a semiconductor substrate 12. As shown in FIG. 3, such circuits 10 are formed on and throughout a semiconductor wafer to fabricate a semiconductor wafer for detecting defects of wiring 50. It should be noted that the size of each of the circuits for detecting defects of wiring 10 may be any convenient size, such as the size of the die or chip of actual integrated circuit formed on a semiconductor substrate. It is also possible to rotate the direction of the wires 16 and 18 by 90 degrees, such that the wires 16 and 18 run perpendicular to the direction of the wires 16 and 18 shown in FIG. 1. Also, it is possible to form the circuits for detecting defects of wiring 10 on a semiconductor wafer in both directions, such that there exist the wiring of the circuits 10 having directions different from each other by 90 degrees.

As shown in FIG. 1, each of one of the ends of the wires 16 is commonly connected by a connecting conductor portion 16a. On the other hand, each of the wires 18 is separately formed and is not connected to other wires. Also, both the wires 16 and the wires 18 are in an electrically floating condition, and are capacitively coupled to the semiconductor substrate 12 via the insulating layer 14. In this embodiment, the size of each of the wires 18 is substantially the same, and the shape of each of the wires 18 is also substantially the same.

The wires 16 and the wires 18 are formed in the same patterning process. Also, in order to attain the object of the present invention, it is preferable that the spaces between the wires (conductors) 16 and the wires (conductors) 18 are set to the minimum feature size or the minimum rule width of the manufacturing apparatus used for fabricating semiconductor devices in the manufacturing line to be tested.

Now, explanation will be made of a method for detecting defects of wiring using the wafer for detecting defects of wiring 50 mentioned above. First, a semiconductor wafer for making the wafer for detecting defects of wiring is introduced into a manufacturing line to be tested, and the circuits for detecting defects of wiring 10 as shown in FIGS. 1 and 2 are formed on the semiconductor wafer. Then, an electron beam scanning is performed on the thus formed circuits for detecting defects of wiring 10 on the semiconductor wafer for detecting defects of wiring 50 in the direction shown by an arrow S in FIG. 1. Such scanning of an electron beam and observation of charged up electric charge can be performed, for example, by using a SEM (scanning electron microscope). In this case, the electron beam is radiated and scanned onto the surface of the wafer for detecting defects of wiring, that is, onto the top surface of the circuits for detecting defects of wiring 10 in the direction of the arrow S by the SEM. Energy of the electron beam is not particularly limited, but approximately 1 keV is preferable.

The wires 16 and 18 which received the electron beam are respectively charged up and thereby generate secondary electrons. Since the capacitance of the wires 16 and the capacitance of the wires 18 with respect to the semiconductor substrate 12 differ from each other, the quantity of the secondary electrons generated from the wires 16 and that generated from the wires 18 differ from each other. That is, when the quantity of the secondary electrons generated from the wires 16 and the wires 18 is measured, the quantity of the secondary electrons generated from the wires 16 is usually smaller than the quantity of the secondary electrons generated from the wires 18. This is because the area of each of the wires 18 is smaller than the total area of the wires 16 commonly coupled by the connecting conductor portion 16a, and the quantity of charged up electric charge of each of the wires 18 is larger than that of the wires 16 commonly coupled by the portion 16a.

However, when any of the wires 18 contacts (short-circuits) the wires 16 at any portion due to, for example, the deviation of location of the wires 16 or 18, defect of mask patterns, and the like, the capacitance of the wire(s) 18 contacting the wire(s) 16 becomes large. Therefore, the quantity of electric charge accumulated in the wire(s) 18 contacting the wire(s) 16 becomes small, and the quantity of secondary electrons detected also becomes small.

In this case, it is possible, for example, to dispose a deceleration grid in front of a secondary electron detector and to detect only secondary electrons having energy level larger than a predetermined energy level. By using this constitution, such predetermined energy becomes a threshold value which is used to detect whether any of the wires 16 and the wires 18 contact (short-circuit) each other or not, depending on whether the secondary electrons having an energy level exceeding the threshold value is detected or not. That is, by using such constitution, it is possible to discriminate the secondary electrons from the wire(s) 18 contacting the wire(s) 16 and the secondary electrons from the wire(s) 18 not contacting the wire(s) 16.

In another way, it is possible to observe an image of secondary electrons from the circuit for detecting defects of wiring 10 by the SEM, and to compare brightness of the images of the secondary electrons from respective wirings, for example, by human eyes, thereby to detect one or more portions where wirings 16 and the wirings 18 contact each other. In this case, if the circuit for detecting defects of wiring 10 is formed normally, that is, the wires 16 and the wires 18 are fabricated without contacting each other, the brightness of the secondary electron image of respective wires 18 differs from the brightness of the secondary electron image of the respective wires 16 adjacent the wires 18, reflecting the quantity of the secondary electrons detected from the respective wires. In this case, the brightness of the secondary electron image of the respective wires 18 is substantially the same. Therefore, the secondary electron image of the wires 16 and the wires 18 disposed in the direction of the arrow S in FIG. 1 becomes a secondary electron image in which a secondary electron image having high brightness and a secondary electron image having low brightness are disposed alternately. When the secondary electron image is observed by the SEM, it is possible to invert the polarity of brightness of the secondary electron image displayed on a screen.

On the other hand, if any of the wires 18 contacts the wires 16, the quantity of the secondary electrons detected from the wire(s) 18 contacting the wire(s) 16 decreases as mentioned above. Therefore, the brightness of the secondary electron image of the wire(s) 18 differ from the brightness of the secondary electron image of the normally formed wires 18, and become nearly the same as that of the secondary electron image of the adjacent wires 16. Consequently, by observing the secondary electron image of the circuit for detecting defects of wiring 10 by using, for example, a SEM, and by detecting the wire or wires 18 whose brightness differ from other wires 18, it is possible to easily find the wire or wires 18 contacting the wiring 16.

As mentioned above, one or more portions in which the wires 16 and wires 18 contact each other due to some malfunction can be detected by measuring the secondary electrons generated from the wires 16 and the wires 18. By inspecting the detected defective wiring using, for example, a dust particle inspector or a contamination inspector which uses light scattering system, or picture comparison system of optical image or scanned secondary electron image, it is possible to find one or more actual short-circuited portions and confirm the situation of defects, to thereby resolve cause and the like of defects of wiring in the manufacturing line.

In this way, by forming the circuits for detecting defects of wiring 10 on a semiconductor wafer in the manufacturing line to be tested, it is possible to know beforehand in which portions of the semiconductor wafer the defects of wiring tend to occur and what kind of defects tends to occur. By using this information, the manufacturing line can be fixed and adjusted, and it is possible to avoid the occurrence of a malfunction of wiring formation when actual products are produced in the manufacturing line. Also, according to this method, test pads required in the prior art technique are not necessary and therefore the wires 16 and wires 18 can be formed finely throughout the surface of the semiconductor wafer, so that very high test precision can be realized compared to the prior art technique. Further, since patterns of the circuit 10 for detecting defects of wiring are patterns near the wiring patterns of the actual semiconductor devices, a test of the manufacturing line can be done in conditions near the conditions wherein the semiconductor devices are actually manufactured. Also, since the wires 16 and the wires 18 are in an electrically floating condition, through holes and the like for connecting the wirings to the semiconductor substrate are not required, and manufacturing of the circuit for detecting defects of wiring 10 is itself quite easy.

Figure 4:
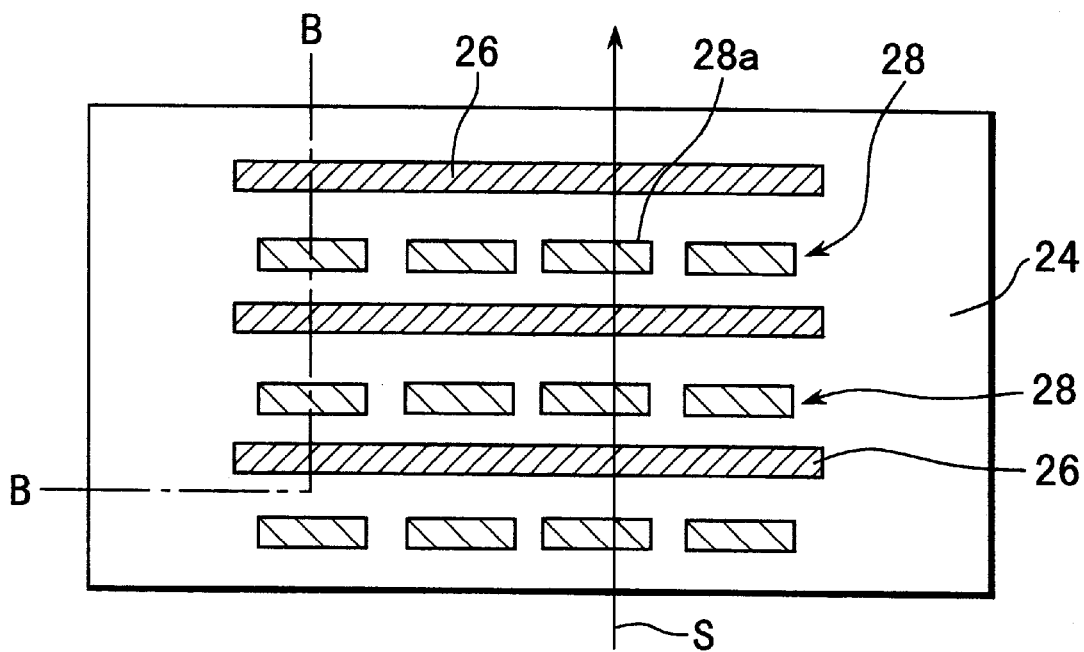
FIG. 4 is a plan view of a circuit for detecting defects of wiring according to another embodiment of the present invention.
Figure 5:
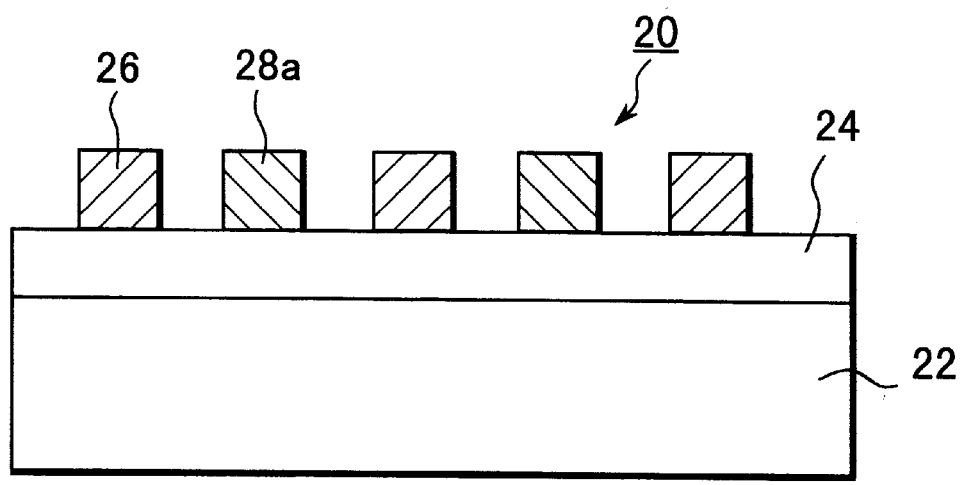
FIG. 5 is a sectional view of the circuit of FIG. 4, taken along the line B—B of FIG. 4.
Figure 6:
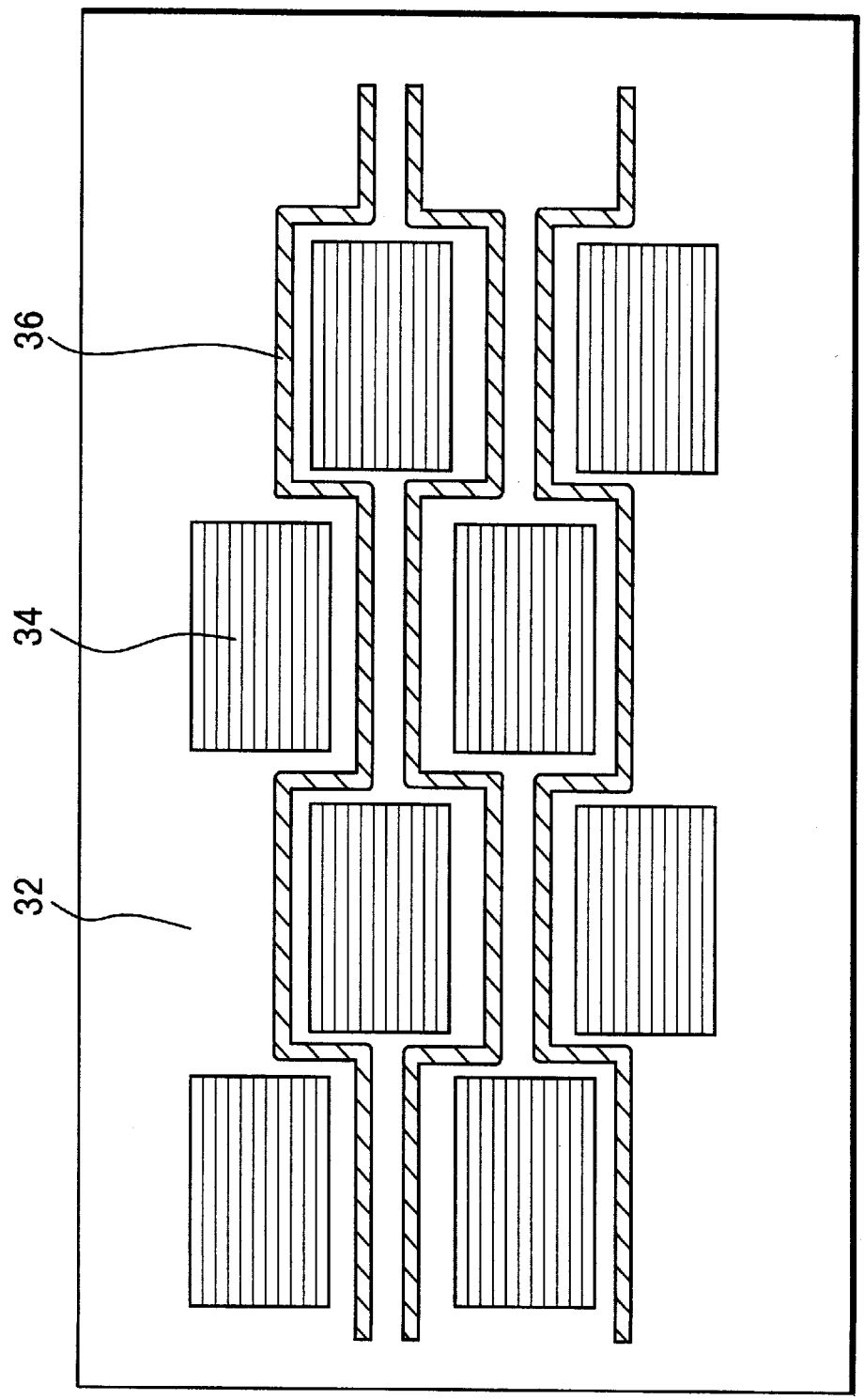
FIG. 6 is a plan view of a conventional circuit for detecting defects of wiring.
Figure 7:
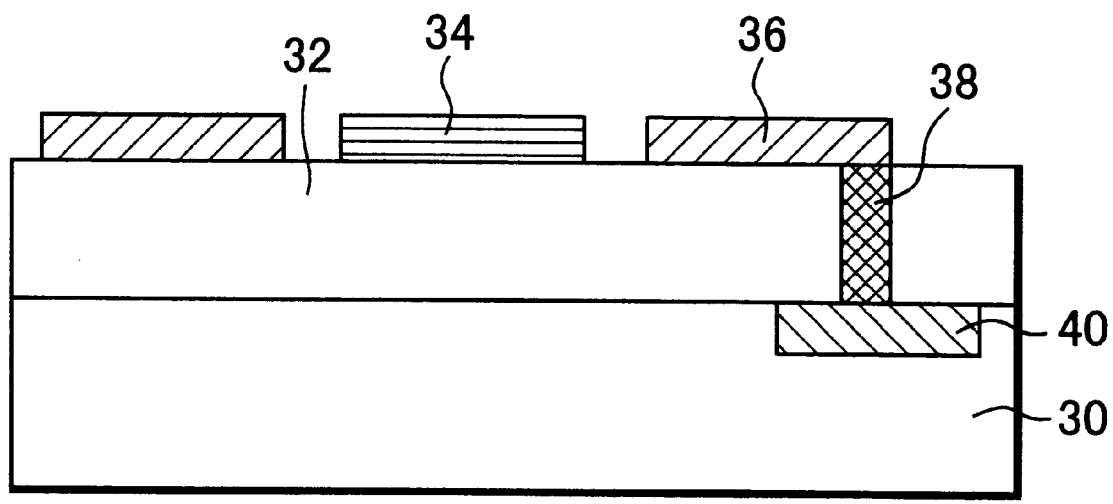
FIG. 7 is a schematic cross sectional view of the circuit of FIG. 6.

Now, explanation will be made of a circuit for detecting defects of wiring according to another embodiment of the present invention. FIG. 4 is a plan view showing a circuit for detecting defects of wiring 20 according to another embodiment of the present invention. FIG. 5 is a cross sectional view of the circuit for detecting defects of wiring 20 taken along the line B—B of FIG. 4. As shown in FIGS. 4 and 5, the circuit for detecting defects of wiring 20 according to this embodiment comprises wires 26 and broken wires 28 made of conductive material and formed on an insulating layer 24 which covers a semiconductor substrate 22. The circuits for detecting defects of wiring 20 having such constitution are formed on a whole surface of a semiconductor wafer to form a semiconductor wafer for detecting defects of wiring 50a as shown in FIG. 3.

As shown in FIG. 5, the wires 26 and the broken wires 28 are formed alternately. Each of the broken wires 28 comprised of a plurality of wiring sections 28a. Therefore, the size of the wiring section 28a is smaller than that of the wire 26. Also, both the wires 26 and the broken wires 28 are in an electrically floating condition, and are capacitively coupled to the semiconductor substrate 22 via the insulating layer 24.

The wires 26 and the broken wires 28 are formed in the same patterning process. Also, in order to attain the object of the present invention, it is preferable that the spaces between the wires 26 and the broken wires 28 receiving are set to the minimum feature size or the minimum rule width of the manufacturing apparatus used for fabricating semiconductor devices in the manufacturing line to be tested.

The method for detecting defects of wiring which uses such a circuit for detecting defects of wiring 20 is the same as the above-mentioned method using the circuit for detecting defects of wiring 10. That is, in the manufacturing line to be tested, the circuits for detecting defects of wiring 20 are formed on a semiconductor wafer to fabricate the wafer for detecting defects of wiring 50a. (FIG. 3) Then, an electron beam is scanned onto the circuits 20 on the wafer for detecting defects of wiring 50a in the direction shown by the arrow S in FIG. 4. This can be performed by using the SEM. Thereby, the wires 26 and the broken wires 28 receiving the electron beam are charged up by the electron beam and generate secondary electrons. Since the capacitance of the wiring section 28a and the capacitance of the wires 26 with respect to the semiconductor substrate 22 differ from each other, the quantity of the secondary electrons generated from the wiring section 28a and the wire 26 differ from each other. Normally, a larger quantity of secondary electrons is detected from the wiring section 28a than the quantity of the secondary electrons from the wire 26. However, when there is a defect in the wires 26 or broken wires 28, such as deviation of location of the wires, and any of the wires 26 and any of the wiring sections 28a contact or short-circuit each other, the capacitance of the wiring section 28a contacting the wire 26 becomes large and the quantity of electric charges charged up in the wiring section 28a becomes small. Therefore, the quantity of the secondary electrons detected from such wiring section 28a becomes smaller than those detected from other wiring sections 28a. By measuring or observing the reduced quantity of secondary electrons from such wiring section 28a, it is possible to detect the existence and location of the defect easily and reliably. In this case, as in the above-mentioned embodiment, it is possible to dispose a deceleration grid in front of a secondary electron detector and to detect only secondary electrons having energy level larger than a predetermined energy level. In another way, as also mentioned in the above embodiment, it is possible to observe an image of secondary electrons from the circuit for detecting defects of wiring 20 by the SEM, and to compare brightness of the images of the secondary electrons from respective wires, for example, by human eyes, thereby to detect one or more portions where wires 26 and the wiring sections 28a contact each other.

By inspecting the detected defective wirings using, for example, a dust particle inspector or a contamination inspector which uses light scattering system, or picture comparison system of optical image or scanned secondary electron image, it is possible to find one or more actual short-circuited portions and confirm the situation of defects, to thereby resolve the cause of defects of wiring and the like in the manufacturing line.

In this embodiment, the following advantageous effect is obtained in addition to the advantageous effect of the above-mentioned first embodiment. That is, the length of the wiring section 28a (FIG. 4) is shorter than the length of each of the wires 18 (FIG. 1) in the previously mentioned circuit for detecting defects of wiring 10. Therefore, it is possible to precisely detect in which portion a defect of wiring has occurred. To this end, after detecting the defective wiring by detecting the quantity of the secondary electrons, it is easy to test by using the dust particle inspector or a contamination inspector which uses light scattering system or picture comparison system of an optical image or a scanned secondary electron image.

It should be noted that, in the circuit for detecting defects of wiring 20 of the second embodiment, one end of each wire 26 may also be commonly connected, in a manner similar to the circuit for detecting defects of wiring 10 of the first embodiment.

As mentioned above, according to the present invention, defects of wiring caused by the malfunction or inappropriate setting of parameters in a semiconductor manufacturing line can be detected beforehand with high precision, and it is possible to greatly improve the manufacturing yield of actual products.

Also, by testing if wiring is formed normally without defects by using the circuit for detecting defects of wiring according to the present invention in one or more manufacturing conditions, it is possible to search for an optimal manufacturing condition of forming wiring in a semiconductor manufacturing line.

Further, by periodically introducing a semiconductor wafer into the manufacturing line to fabricate a semiconductor wafer for detecting defects of wiring and by inspecting the fabricated semiconductor wafer for detecting defects of wiring, it is possible to appropriately administer and control a semiconductor manufacturing line.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A method for detecting defects of wiring to detect a malfunction of a fabrication process of a wiring in a semiconductor device manufacturing method, the method comprising:

forming a plurality of circuits for detecting defects of wiring on an insulating film formed on a semiconductor substrate, in a manufacturing line to be tested, said circuit comprising a first wire which is in an electrically floating condition, and a second wire which is in an electrically floating condition and which is disposed adjacent said first wire, wherein the capacitance between said second wire and said semiconductor substrate is larger than the capacitance between said first wire and said semiconductor substrate;

scanning an electron beam on the surfaces of said first wire and said second wire; and detecting secondary electrons emitted from said first wire and said second wire.

2. A method for detecting defects of wiring as set forth in claim 1, wherein said scanning an electron beam on the surfaces of said first wire and said second wire is performed such that said electron beam traverses both said first wire and said second wire.

3. A method for detecting defects of wiring as set forth in claim 1, wherein said detecting secondary electrons emitted from said first wire and said second wire detects only secondary electrons having energy level larger than a predetermined energy level, among said secondary electrons emitted from said first wiring and said second wiring.

4. A method for detecting defects of wiring as set forth in claim 3, wherein a deceleration grid is disposed in front of a detector for detecting secondary electrons, and only secondary electrons passed through said deceleration grid are detected by said detector.

5. A method for detecting defects of wiring as set forth in claim 1, wherein scanning an electron beam on the surfaces of said first wire and said second wire and detecting secondary electrons emitted from said first wire and said second wire is performed by using a SEM (scanning electron microscope).

6. A method for detecting defects of wiring as set forth in claim 5, wherein, after detecting secondary electrons emitted from said first wire and said second wire, brightness of secondary electron images is compared to detect defects of wiring.

7. A method for detecting defects of wiring as set forth in claim 1, wherein said forming a plurality of circuits for detecting defects of wiring is performed in the same process step as in a manufacturing line to be tested.

8. A method for detecting defects of wiring as set forth in claim 1, wherein the area of said second wire is larger than the area of said first wire.

9. A method for detecting defects of wiring as set forth in claim 1, wherein said first wire and said second wire are formed parallel to each other, and a space between said first wire and said second wire is the minimum feature size of a manufacturing apparatus used for fabricating semiconductor devices in a manufacturing line under test.

10. A method for detecting defects of wiring as set forth in claim 1, wherein said circuit comprises:
- a plurality of said first wires;
- a plurality of said second wires formed in one direction parallel to each other; and
- a connecting conductor portion for electrically coupling one end of each of said plurality of second wires together;

wherein each of said first wires is formed between said second wires and parallel to said second wires.

11. A method for detecting defects of wiring as set forth in claim 1, wherein said circuit comprises:
- a plurality of said first wires; and
- a plurality of said second wires formed in one direction parallel to each other;

wherein each of said first wires is formed between said second wires and parallel to said second wires, and each of said first wires is divided into a plurality of wiring sections disposed along a line in said one direction.

* * * * *